United States Patent
Armbruster

(10) Patent No.: US 6,756,792 B2
(45) Date of Patent: Jun. 29, 2004

(54) APPARATUS FOR MEASURING PARASITIC CAPACITANCES ON AN INTEGRATED CIRCUIT

(75) Inventor: Hans-Ulrich Armbruster, Deisenhofen (DE)

(73) Assignee: Infineon Technologies AG, Munich (DE)

( * ) Notice: Subject to any disclaimer, the term of this patent is extended or adjusted under 35 U.S.C. 154(b) by 97 days.

(21) Appl. No.: 10/234,079

(22) Filed: Sep. 3, 2002

(65) Prior Publication Data

US 2003/0071641 A1 Apr. 17, 2003

(30) Foreign Application Priority Data

Sep. 1, 2001 (DE) .......................................... 101 43 034

(51) Int. Cl.[7] .......................... G01R 27/26; G01R 31/26
(52) U.S. Cl. ...................... 324/687; 324/658; 324/679; 324/686; 324/690; 324/719; 324/765
(58) Field of Search ................................ 324/658, 686, 324/687, 679, 690, 719, 765

(56) References Cited

U.S. PATENT DOCUMENTS

| | | | | |
|---|---|---|---|---|
| 5,424,650 A | * | 6/1995 | Frick ........................... | 324/688 |
| 5,661,240 A | * | 8/1997 | Kemp ....................... | 73/514.32 |
| 5,999,010 A | | 12/1999 | Arora et al. ................ | 324/765 |
| 6,098,027 A | * | 8/2000 | Yang ........................... | 702/118 |
| 6,366,111 B1 | * | 4/2002 | Kawai ......................... | 324/765 |
| 6,501,282 B1 | * | 12/2002 | Dummermuth et al. ..... | 324/679 |
| 6,586,943 B1 | * | 7/2003 | Masuda et al. ............. | 324/500 |

OTHER PUBLICATIONS

Chen, J. C. et al.: "An On–Chip, Attofarad Interconnect Charge–Based Capacitance Measurement (CBCM) Technique", IEEE, 1996, pp. 3.4.1–3.4.4.
Sauter, S. et al.: "Measurement and Simulation of Interconnect Capacitance Variations", IEEE, Jun. 2000, pp. 64–67.

* cited by examiner

*Primary Examiner*—N. Le
*Assistant Examiner*—John Teresinski
(74) *Attorney, Agent, or Firm*—Laurence A. Greenberg; Werner H. Stemer; Ralph E. Locher

(57) ABSTRACT

The novel apparatus permits precise measurements of parasitic capacitances. The apparatus has a test structure and a reference structure, each with two conductor tracks. In the reference structure, the two conductor tracks are always at the same potential. In the test structure, one conductor track is coupled to ground potential and the other conductor track to a different potential. The test structure and the reference structure are connected to a voltage potential and the charge which builds up on the test structure and the reference structure is registered. The parasitic capacitance can be calculated precisely from the charge difference. The conductors of the test structure and of the reference structure are arranged in such a way that each conductor perceives a relationship to capacitive parasitic effects in the same environment.

10 Claims, 2 Drawing Sheets

APPARATUS FOR MEASURING PARASITIC CAPACITANCES ON AN INTEGRATED CIRCUIT

BACKGROUND OF THE INVENTION

Field of the Invention

The invention relates to an apparatus for measuring parasitic capacitances, which is used in particular in integrated circuits, such as, for instance, a semiconductor memory.

The increasing packing density leads in particular to interference effects resulting from conductor tracks in integrated circuits, referred to as parasitic interconnect capacitance, playing an increasingly major part. Since the conductor tracks themselves are designed to be increasingly smaller, the parasitic effects associated with components (in particular transistors) decrease more and more, but the effects caused by the conductor tracks generally do not. The latter effects therefore become increasingly important, and even small disruptions can lead to failures of integrated circuits in current technologies. A very accurate method is therefore required in order to be able to register disturbance effects, i.e., parasitic effects.

In determining parasitic effects, an extremely wide range of measuring methods is employed. For example, from James C. Chen et al., "An On-Chip, Attofarad Interconnect Charge-Based Capacitance Measurement Technique", IEDM 96-69, IEEE, 0-7803-3393-4, it is known to connect a test structure and a reference structure to a voltage source and then to discharge the test structure and the reference structure again via a ground potential. In the process, the current flowing during the charging of the reference structure and the test structure is measured, and the difference is used to calculate a parasitic capacitance which is present in the test structure as opposed to the reference structure.

The test structure and the reference structure are constructed differently. It is possible both for the geometric form of the two structures to differ and their environment, and the test structure therefore has a different capacitance than the reference structure. This can be measured in the form of an additional charge during the charging or discharging of the test structure as compared with the reference structure. By using the difference between the capacitances determined, systematic errors arising from the components used for the circuit can also be minimized, since these occur to the same extent in the test and reference structures.

Furthermore, from the thesis by Stefan Sauter, Fakultät für Elektrotechnik und Informationstechnik, Technische Universität München, [Electrical Engineering and Information Technology Faculty, Technical University of Munich] chapter 5, it is known to measure extremely small parasitic capacitances with a novel sub-femtofarad method.

SUMMARY OF THE INVENTION

It is accordingly an object of the invention to provide an apparatus, which overcomes the above-mentioned disadvantages of the heretofore-known devices and methods of this general type and which, in simple terms, provides for an improved apparatus for measuring parasitic capacitances.

With the foregoing and other objects in view there is provided, in accordance with the invention, an apparatus for measuring parasitic capacitances of an integrated circuit, comprising:

a test structure having a first conductor and a second conductor;

a reference structure having a third conductor;

a first switch for selectively connecting the first conductor to a first voltage source and a second switch for selectively connecting the first conductor to ground potential;

a third switch for selectively connecting the third conductor to a second voltage source and a fourth switch for selectively connecting the third conductor to ground potential;

the reference structure having a fourth conductor connected to the third switch for selectively connecting the fourth conductor to the second voltage source and to the fourth switch for selectively connecting the fourth conductor to ground potential;

wherein a coupling capacitance between the first conductor and the second conductor substantially equals a coupling capacitance between the third conductor and the fourth conductor;

wherein the first, second, third, and fourth conductors are constructed such that the first and second conductors and the third and fourth conductors respectively have substantially equally large inherent capacitances; and wherein the second conductor is directly connected to reference potential, such that the first conductor and the second conductor can assume mutually different potentials.

In other words, one characterizing feature of the invention is that the test structure and the reference structure are constructed from at least two pairs of conductors, the two conductors always being at the same potential in the reference structure and the two conductors in the test structure also being able to assume different potentials. A further characterizing feature of the invention is that the conductor to be tested and the associated conductor are arranged substantially in the same environment in relation to capacitive effects. In this way, the coupling capacitance between the two conductors is of equal size, so that the evaluation of the measured results is simplified.

In accordance with a preferred embodiment of the invention, the test structure and the reference structure are built up on a semiconductor material, which preferably has a semiconductor memory module. Use of the apparatus according to the invention in the area of integrated circuits which are built up on semiconductor materials constitutes an important field of application. In particular in the case of highly integrated modules such as semiconductor memory components, the measurement of parasitic capacitances is a significant method for characterizing the quality of the semiconductor memory component.

In a preferred embodiment, the first, the second, the third and the fourth conductor of the reference structure and the test structure are constructed in the form of conductor tracks, i.e., interconnects. Depending on the application, it is particularly advantageous to construct the four conductors identically. A particularly preferred embodiment of a conductor track consists in constructing a substantially rectangular conductor strip, which preferably has a uniform thickness and width over the entire length. In addition, the distance between the two conductor tracks of the test structure and of the reference structure, respectively, is preferably of equal size over the entire length. By means of this embodiment, particularly exact measured results are made possible.

The two conductors of the test structure and/or of the reference structure are preferably arranged in an environment which, apart from a predefined distance for the two conductors of the test structure and/or of the reference structure, is preferably identical in relation to capacitive effects. Thus, one-sided capacitive effects, which could occur in a conductor of the test structure or of the reference structure, are avoided.

In accordance with a concomitant feature of the invention, the first and second conductors and/or the third and fourth conductors are constructed as an intermeshing comb structure.

Other features which are considered as characteristic for the invention are set forth in the appended claims.

Although the invention is illustrated and described herein as embodied in an apparatus for measuring parasitic capacitances on an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
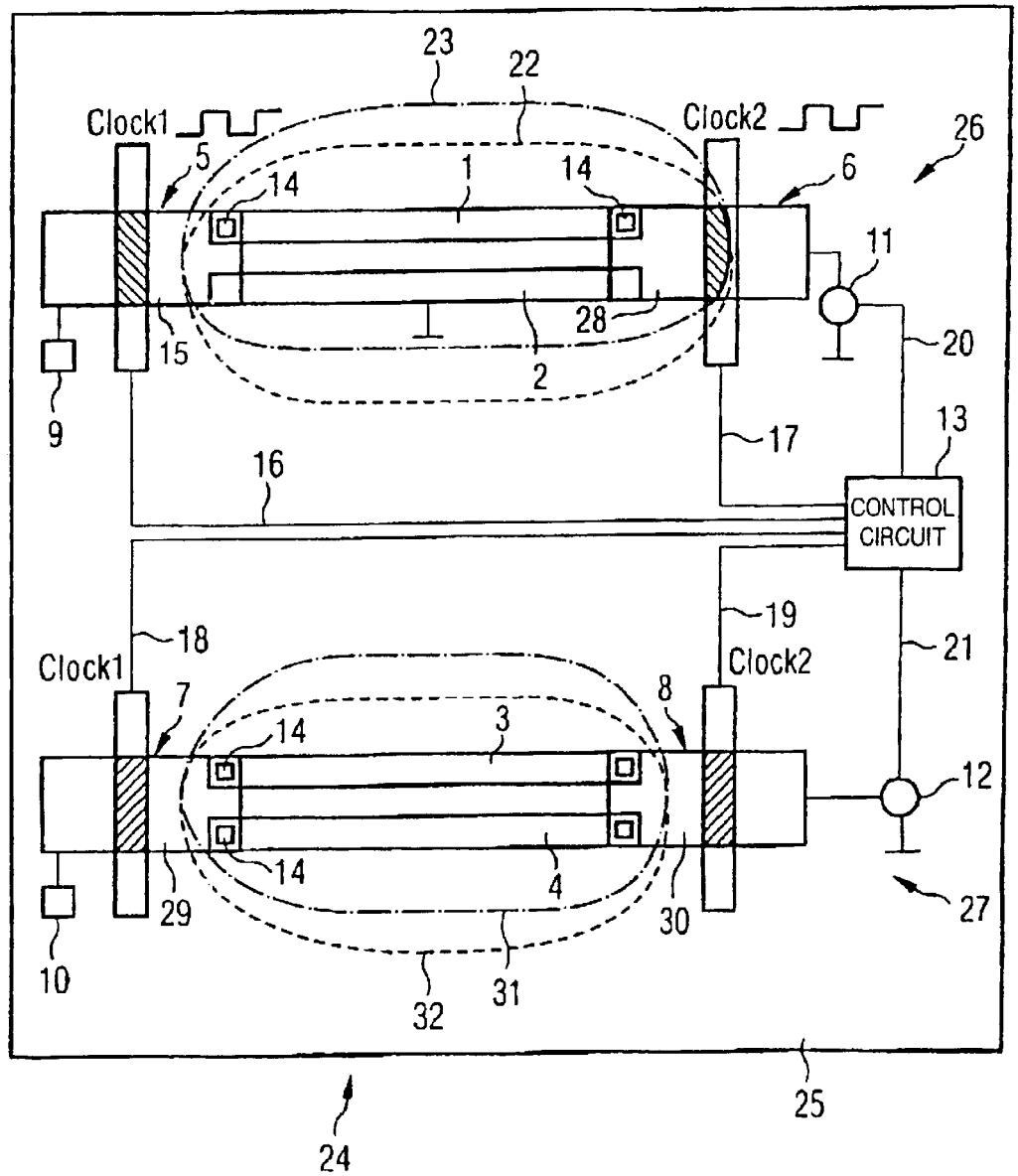
FIG. 1 is a circuit schematic and a diagram of a semiconductor module with an apparatus according to the invention.

Referring now to the figures of the drawing in detail and first, particularly, to FIG. 1 thereof, there is shown a detail of a semiconductor memory component 24, illustrated schematically, which is formed on a semiconductor substrate 25. The invention will be described by using the example of a semiconductor module, but the application of the apparatus according to the invention to any type of structure to be measured, in particular to a structure to be measured on a semiconductor material, is advantageous. For example the invention can also be employed in integrated circuits which are partially of analog and digital construction and, for example, are applied to a ceramic substrate.

For example, the semiconductor module 24 has the circuit parts which are usual for a DRAM memory module, but which are not explicitly illustrated in FIG. 1. In addition to the usual circuit parts, the apparatus according to the invention is applied to the semiconductor module 24.

A test structure 26 is arranged in the upper region of the semiconductor module 24, and a reference structure 27 is arranged in the lower region. The test structure 26 has a first and a second electric conductor 1, 2 which are in each case constructed in the form of a rectangular conductor track. The first and the second conductors 1, 2 are preferably constructed identically and arranged beside each other and parallel to each other at a defined distance. The first and the second conductor 1, 2 are led with both end regions as far as over two line areas 15, 28, the end regions of the first conductor 1 being electrically conductively connected to the line areas 15, 28 via contact connections 14. The end regions of the second conductor 2 are electrically insulated with respect to the line areas 15, 28 via electrically insulating layers, such as silicon dioxide. The line areas 15, 28 are electrically conductively connected to a first and second switch 5, 6. A second input of the first switch 5 is electrically conductively connected to a first voltage source 9, preferably via a further line area. A second input of the second switch 6 is connected to a ground potential via a further line area and via a first current intensity measuring instrument 11. The first and the second switch 5, 6 are preferably constructed in the form of MOS transistors. Depending on the switching state of the first switch 5, the first line area 15 is either electrically insulated or electrically conductively connected to the first voltage source 9. In addition, depending on the switching state of the second switch 6, the second line area 28 is either electrically insulated or electrically conductively connected to ground potential. Instead of ground potential, another reference potential can also be used.

The first and the second switch 5, 6 are connected to a control circuit 13 via a first and second control line 16, 17 respectively. In addition, the first current intensity measuring instrument 11 is connected to the control circuit 13 via a first measuring line 20.

A significant feature of the test structure 26 is that the first and the second conductor 1, 2 have substantially virtually identical environments in relation to capacitive effects. This is illustrated schematically in the form of a first and second environment area 23, 22. The first and the second environment areas 23, 22 are arranged symmetrically with respect to the first and second conductors 1, 2. The first environment area 23 is represented in the form of a dash-dotted border, and the second environment area 22 is represented in the form of a dashed border. Because of the offset arrangement of the first and the second conductor 1, 2 in relation to each other, the first and the second environment areas 23, 22 are also offset laterally with respect to each other. The first and second environment area 23, 22 schematically delimits the area which has a capacitive effect on the first and the second conductor. Therefore, the first and the second conductors 1, 2 are virtually identical environments in relation to capacitive control effects. The magnitude of the capacitances of the first and second conductor 1, 2 in relation to the conductors in their respective environment is therefore identical, which permits the direct evaluation of the measurement for determining the coupling capacitance between the first and second conductor 1, 2.

The reference structure 27 has substantially a third and fourth conductor 3, 4, which are preferably constructed in the form of rectangular conductor tracks with a defined thickness and width preferably over the entire length of the conductor track. The third and the fourth conductor are preferably constructed parallel to each other at a fixed distance. The end regions of the third and fourth conductor are led over a third and fourth line area 29, 30 respectively. The end regions of the third and fourth conductor 3, 4 are electrically conductively connected to the third and fourth line area 29, 30 via contact connections 14. The third line area 29 is electrically conductively connected to a first connection of a third switch 7. The third switch 7 has a second connection which is electrically conductively connected to a second voltage source 10 via a line area. The fourth line area 30 is electrically conductively connected to a first connection of a fourth switch 8. The fourth switch 8 has a second connection, which is electrically conductively connected to a ground potential via a line area and via a second current intensity measuring instrument 12.

The third and the fourth switch 7, 8 are preferably constructed in the form of MOS transistors. The third and the fourth switch 7, 8 are connected to the control circuit 13 via a third and fourth control line 18, 19. The second charge measuring instrument 12 is connected to the control circuit 13 via a second measuring line 21.

The third and the fourth conductor 3, 4 are preferably arranged to be constructed in accordance with the first and the second conductor 1, 2 and have a third and fourth environment 31, 32, in which the capacitive parasitic effects with respect to the third and the fourth conductor are identical. The third environment area 31 is illustrated schematically in the form of a dash-dotted border, and the fourth environment area 32 is illustrated schematically in the form of a dashed border.

The geometric arrangement of the reference structure 27 is therefore identical to the test structure 26, which limits systematic errors in forming the difference between the measured values.

The classical method of capacitance measurement is based on the four-point measuring technique. In this case, an alternating current is impressed via two points, and the voltage is tapped off via two further points. An influence of the parasitic capacitances which, for example, occur in the feed lines, is therefore largely compensated for. Via phase shift and resulting amplitude, the complex impedance Z is calculated in accordance with the following formula:

$$Z=R+(1/jwc).$$

However, the inaccuracies arising from different contact capacitances of the measuring tips and from the pad capacitances remain as well. It is therefore necessary to select the capacitance to be measured to be relatively large.

An improvement in the measuring method is achieved by way of the following procedure. In order to measure capacitances of minimum conductor tracks, the four-point measuring method is no longer adequate. For a conductor track which, for example, is constructed from metal and has a length of 250 $\mu$m and a width of 0.5 $\mu$m, the result is a capacitive loading of approximately 100 femtofarad. It is therefore necessary to employ a new measuring method which permits capacitances down to the sub-femtofarad range to be measured accurately. In the novel measuring method, two capacitances are recharged continually. In the exemplary embodiment used, these are the two different capacitances of the test structure 26 and of the reference structure 27. Because of the different capacitances, a differential current results, which differs only in terms of the additional capacitance, which becomes effective because the second conductor 2 is designed to be electrically insulated with respect to the first and the second line area 15, 28 and is additionally connected to a ground potential.

Figure 2:
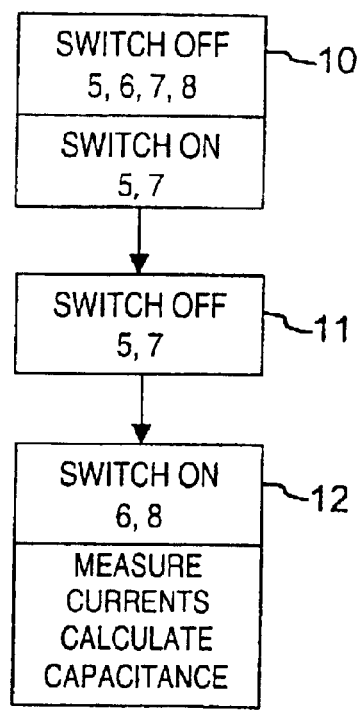
FIG. 2 is a schematic flowchart illustrating a method of operating the apparatus according to the invention.

Reference will now be had to FIG. 2. In order to carry out the measuring method, in the starting position, the control circuit 13 switches the first, the second, the third and the fourth switch 5, 6, 7, 8 off at program item 10. Then, first of all the first and the third switch 5, 7 are switched on. As a result of this, the first conductor 1 is electrically conductively connected to the first voltage source 9. In the reference structure 27, the third and the fourth conductor 3, 4 are electrically conductively connected to the second voltage source 10. The first and the third switch are switched on until the test structure and the reference structure are charged up completely.

Then, at program item 11, the control circuit 13 switches the first and the third switch 5, 7 off. In a following program item 12, the second and the fourth switch 6, 8 are switched on. As a result, the charge present on the conductor 1 flows to ground via the first current intensity measuring instrument 11. The amount of charge which has flowed away is registered by the control circuit 13. At the same time, the charge present on the third and fourth conductors 3, 4 flows away to ground via the fourth switch 8, which has been turned on, and via the second current intensity measuring instrument 12. The charge registered by the second current intensity measuring instrument 12 is reported to the control circuit 13.

Trials have shown that, for capacitances in the femtofarad range, the measuring frequency at which the first and third and second and fourth switches 5, 7, 6, 8 are switched is in the order of about 1 MHz. The charge currents flowing during the discharging of the test structure and of the reference structure may be determined very accurately with conventional current intensity measuring instruments 11, 12 which have a measuring accuracy of $10^{-13}$ A. From the values determined, the control circuit 13 calculates the differential current $\Delta I = I1-I2$ together with the frequency f and the voltage $V_D$ which is provided by the first and the second voltage source 9, 10, and an averaged reference current $I_v$ in accordance with the following formula:

$$I_v = 1/T \cdot \int_0^{V_D} \cdot C \cdot dU = C \cdot V_D \cdot f.$$

The capacitance to be found, $C=I_1-I_2/V_D \cdot f$ is therefore calculated from the relationship $I_v = \Delta I = I_1 - I_2$. The capacitance C calculated from the measurement operation is calculated in accordance with the above-described formula by the control circuit 13 at program item 12.

Furthermore, by using the described arrangement, the parasitic effect of the second conductor 2 on the first conductor 1 can be calculated in accordance with the test structure 26 if the second conductor 2 is not at the same potential as the first conductor 1. In this case, the ground potential, to which the second conductor 2 is connected, is additionally viewed as a third conductor. The calculation of the capacitances of the test structure is possible in accordance with the following method:

$$\begin{pmatrix} q_1 \\ q_2 \\ q_m \end{pmatrix} = \begin{pmatrix} c_{11} c_{12} c_{13} \\ c_{21} c_{22} c_{23} \\ c_{31} c_{32} c_{33} \end{pmatrix} \begin{pmatrix} U_1 \\ U_2 \\ U_m \end{pmatrix}$$

where $q_1$=charge on the first conductor 1, $q_2$=charge on the second conductor 2, $q_m$=charge on ground and environment conductors, $U_i$ are the associated electrostatic potentials.

For the assessment of parasitic capacitances, the magnitude of the coupling capacitance $C_{12}=C_{21}$ is of substantial importance. In the test method described, the voltage $U_2$ of the second conductor and the voltage $U_m$ of the ground potential are set to the value 0. The charge $q_1$ is then measured as the test charge $q_{test}$, $q_1$ being calculated in accordance with the formula $q_1 = C_{11} \cdot U_1$.

In the reference case, on the other hand, which is represented by the reference structure, only the voltage $U_m$ is set to 0, and the following formula is used:

$$\begin{pmatrix} q_3 \\ q_4 \\ q_m \end{pmatrix} = \begin{pmatrix} c_{11} c_{12} c_{13} \\ c_{21} c_{22} c_{23} \\ c_{31} c_{32} c_{33} \end{pmatrix} \begin{pmatrix} U_3 \\ U_4 \\ U_m \end{pmatrix}$$

where $q_3$=charge on the third conductor 3, $q_4$=charge on the fourth conductor 4, $q_m$=charge on ground and environment conductors. Because of the symmetry between test and reference structures, the capacitance matrices used in this case are identical.

Given the wiring of the reference structure, the result is therefore:

$$q_{ref}=q_3+q_4=c_{11}U_3+c_{12}U_4+c_{21}U_3+c_{22}U_4$$

The potentials are selected identically during the measurement; $U_1=U_2=U_3=U_4$. The capacitance matrix is symmetrical by definition: $c_{12}=c_{21}$ $$\Rightarrow q_{ref}=c_{11}U_1+2c_{12}U_1+c_{22}U_1.$$

Because of the intrinsic symmetry of the test and reference structures (the first conductor 1 has an equivalent environment to that of the second conductor 2, and the third conductor 3 has an equivalent environment to that of the fourth conductor 4), the result is the simplification $c_{11}=c_{22}$. From this, it follows that:

$$\Rightarrow q_{ref}=2(c_{11}+c_{12})U_1.$$

The value for $c_{11} \cdot U_1=q_1$ is known from the measurement of the test structure. This value has been determined with the test structure.

The determination of the coupling capacitance $C_{12}=C_{21}$ is therefore given by the formula in accordance with the following formula:

$$c_{12} = \frac{q_{ref} - 2q_{test}}{2U_1}$$

Both $q_{ref}$ and $q_{test}$ have been measured by the control circuit 13. $q_{test}=q_1=c_{11} \cdot U_1 \cdot U_1$ is defined as the value for the first and second voltage source 9, 10. The coupling capacitance $C_{12}$ or $C_{21}$ can therefore be calculated in a straightforward manner.

The calculation of the coupling capacitance provides conclusions about parasitic effects between the first and the second conductor 1, 2. On the basis of these parasitic effects, a statement about the susceptibility of the entire circuit arrangement to interference can be made. The apparatus according to the invention is therefore used to characterize the quality of the semiconductor module.

Figure 3:
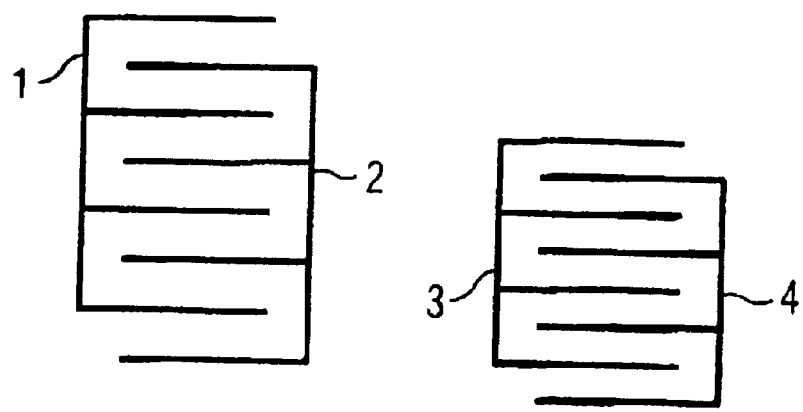
FIG. 3 is a plan view of a comb structure.

FIG. 3 shows a preferred embodiment of the first, second, third and fourth conductor 1, 2, 3, 4. The conductors are constructed in the form of two comb structures which are intermeshed.

I claim:

1. An apparatus for measuring parasitic capacitances of an integrated circuit, comprising:

a test structure having a first conductor and a second conductor;

a reference structure having a third conductor;

a first switch for selectively connecting said first conductor to a first voltage source and a second switch for selectively connecting said first conductor to ground potential;

a third switch for selectively connecting said third conductor to a second voltage source and a fourth switch for selectively connecting said third conductor to ground potential;

said reference structure having a fourth conductor connected to said third switch for selectively connecting said fourth conductor to said second voltage source and to said fourth switch for selectively connecting said fourth conductor to ground potential;

wherein a coupling capacitance between said first conductor and said second conductor substantially equals a coupling capacitance between said third conductor and said fourth conductor;

wherein said first, second, third, and fourth conductors are constructed such that said first and second conductors and said third and fourth conductors respectively have substantially equally large inherent capacitances; and wherein said second conductor is directly connected to reference potential, such that said first conductor and said second conductor can assume mutually different potentials.

2. The apparatus according to claim 1, wherein said test structure and said reference structure are formed on a semiconductor material.

3. The apparatus according to claim 1, wherein said test structure and said reference structure are formed on a semiconductor memory module.

4. The apparatus according to claim 1, wherein said first, second, third, and fourth conductors are conductor tracks.

5. The apparatus according to claim 1, wherein said first, second, third, and fourth conductors have a substantially identical structure.

6. The apparatus according to claim 1, wherein said first conductor and said second conductor are two mutually parallel, straight conductor tracks, and wherein an environment within a fixed distance relative to said first and second conductors is constructed symmetrically with respect to said first and second conductors.

7. The apparatus according to claim 1, wherein said third conductor and said fourth conductor are mutually parallel, straight conductor tracks, and wherein an environment within a fixed distance relative to said third and fourth conductors is constructed symmetrically with respect to said third and fourth conductors.

8. The apparatus according to claim 1, wherein said first, second, third, and fourth switches are field effect transistors.

9. The apparatus according to claim 1, wherein said first and second conductors are constructed as an intermeshing comb structure.

10. The apparatus according to claim 1, wherein said third and fourth conductors are constructed as an intermeshing comb structure.

* * * * *